United States Patent
Engel et al.

(10) Patent No.: US 7,397,073 B2
(45) Date of Patent: Jul. 8, 2008

(54) BARRIER DIELECTRIC STACK FOR SEAM PROTECTION

(75) Inventors: Brett H. Engel, Hopewell Junction, NY (US); Stephen M. Lucarini, Pleasant Valley, NY (US); John D. Sylvestri, Poughkeepsie, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/904,661

(22) Filed: Nov. 22, 2004

(65) Prior Publication Data

US 2006/0108609 A1 May 25, 2006

(51) Int. Cl.
*H01L 29/76* (2006.01)
(52) U.S. Cl. .................. 257/288; 257/635; 257/637; 257/640; 257/649; 257/E23.134; 257/E21.507; 257/E21.627; 257/E21.641
(58) Field of Classification Search .......... 257/641, 257/382, 384, 288
See application file for complete search history.

(56) References Cited

U.S. PATENT DOCUMENTS

| | | | | | |
|---|---|---|---|---|---|
| 5,851,603 | A | * | 12/1998 | Tsai et al. ............. | 427/579 |
| 5,936,300 | A | * | 8/1999 | Sasada et al. ......... | 257/632 |
| 5,989,983 | A | * | 11/1999 | Goo et al. ............. | 438/473 |
| 6,121,663 | A | * | 9/2000 | En et al. ............... | 257/377 |
| 6,180,977 | B1 | * | 1/2001 | Lin et al. .............. | 257/314 |
| 6,225,209 | B1 | * | 5/2001 | Lin et al. .............. | 438/624 |
| 6,340,829 | B1 | * | 1/2002 | Hirano et al. ......... | 257/347 |
| 6,420,777 | B2 | * | 7/2002 | Lam et al. ............. | 257/640 |
| 6,762,066 | B2 | * | 7/2004 | Holz ...................... | 438/4 |
| 7,009,226 | B1 | * | 3/2006 | Sun ....................... | 257/192 |
| 2001/0048146 | A1 | * | 12/2001 | Wen et al. ............. | 257/639 |
| 2004/0061179 | A1 | * | 4/2004 | Carroll et al. ......... | 257/368 |

* cited by examiner

*Primary Examiner*—Jerome Jackson
*Assistant Examiner*—Jose R Diaz
(74) *Attorney, Agent, or Firm*—Scully, Scott, Murphy & Presser, P.C.; Steven Capella, Esq.

(57) ABSTRACT

The present invention provides a semiconducting device including a gate dielectric atop a semiconducting substrate, the semiconducting substrate containing source and drain regions adjacent the gate dielectric; a gate conductor atop the gate dielectric; a conformal dielectric passivation stack positioned on at least the gate conductor sidewalls, the conformal dielectric passivation stack comprising a plurality of conformal dielectric layers, wherein no electrical path extends entirely through the stack; and a contact to the source and drain regions, wherein the discontinuous seam through the conformal dielectric passivation stack substantially eliminates shorting between the contact and the gate conductor. The present invention also provides a method for forming the above-described semiconducting device.

2 Claims, 4 Drawing Sheets

BARRIER DIELECTRIC STACK FOR SEAM PROTECTION

BACKGROUND OF THE INVENTION

Field of the Invention

The present invention relates to semiconductor devices having enhanced resistance to shorting, and more particularly to metal oxide semiconductor field effect transistors (MOSFETS), in which electrical shorting between the gate conductor and the contacts to the source and drain regions of the device is substantially eliminated by a conformal dielectric passivation stack positioned on at least the sidewalls of the gate region. The inventive conformal dielectric passivation stack comprises at least a first conformal dielectric layer and a second conformal dielectric layer in which no electrical pathway is present that extends entirely through the stack. The absence of the electrical pathway can be achieved by using a second conformal dielectric that is seamless or one in which the seams are offset from the seams present in the first dielectric layer. The second dielectric layer thus covers any seams that may be present in the first conformal dielectric layer.

Field effect transistors (FETs) are the basic building block of today's integrated circuits (ICs). Such transistors can be formed in conventional substrates (such as silicon) or in silicon-on-insulator (SOI) substrates.

State of the Art MOS transistors are fabricated by depositing a gate stack material over a gate dielectric and a substrate. Generally, the MOS transistor fabrication process implements lithography and etching processes to define the conductive, e.g., poly-Si, Si, gate structures. Source/drain extensions are formed by implantation, in which the implant is performed using a spacer to create a specific distance between the gate and the implanted junction. In some instances, such as in the manufacture of an NFET device, the source/drain extensions for the NFET device are implanted with no spacer. For a PFET device, the source/drain extensions are typically implanted with a spacer present. A thicker spacer is typically formed after the source/drain extensions have been implanted. Deep source/drain implants are then performed with the thick spacer present. High temperature anneals are performed to activate the junctions after which the source and drain regions and the top portion of the gate are silicided. Silicide formation typically requires that a refractory metal be deposited on the silicon wafer followed by a high temperature thermal anneal process to produce the silicide material. The structure is then passivated by a blanket deposited conformal dielectric material.

In order to be able to make ICs, such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device degrading effects.

Currently, the barrier passivation being used over MOSFET gate regions is a nitride formed using a deposition process. Referring to FIG. 1, a conventional passivation layer 100 formed of a nitride conformally deposited typically contains seams 101 through the deposited nitride passivation layer 100. The seams 101 are typically present over changes in topography of the deposited surfaces in which there is a change in step height. The seams 101 which extend entirely through the nitride passivation layer 100 provide an electrical path from the adjacent contact 50 to the gate conductor 3, through the region 13 located beneath the overlying gate silicide 12 and the gate conductor 3. This electrical path can, in turn, result in device shorting. In FIG. 1, reference numeral 2 is a gate dielectric, while reference numeral 4 is a spacer.

Further scaling of semiconducting devices requires that the electrical pathways through the seams present in a conventional passivation layer be interrupted to ensure that the electrical pathways between the gate conductor and the contacts to the source and drain region of the device be severed. Therefore, what is needed is a passivation layer and a method of forming thereof which has discontinuous electrical pathways.

SUMMARY OF THE INVENTION

An object of the present invention is to provide a field effect transistor (FET) having a passivation stack comprising at least two passivation layers in which a discontinuous electrical pathway through the passivation stack is provided. In particular, this objective is achieved in the present invention by providing a conformal dielectric layered stack positioned on at least the sidewall portions of the gate conductor, in which a first dielectric layer of the conformal dielectric stack has seams which are covered by a second dielectric layer. The second dielectric may contain seams or it may be seamless. When the second dielectric is seamless, a discontinuous seam is provided in the dielectric stack thereby preventing the formation of a complete electrical pathway to the adjacent metal contact. It is noted that seams are generally introduced into the first dielectric layer because of the difference in step height within the structure.

When the second dielectric layer of the dielectric stack includes seams, the seams of the second dielectric are offset from the seams present in the first dielectric layer therefore providing a discontinuity in the electrical pathway within the deposited layers caused by the seams being aligned. By depositing multiple dielectric layers atop one another, any seams present in the dielectric layers are covered or offset from one another, therefore providing a conformal dielectric layered stack having a discontinuous electrical pathway. In the present invention, the passivation stack thus has discontinuous seams. The term "discontinuous seams" denotes that the seams of each dielectric layer within the conformal dielectric layered stack are covered or offset from one another in a manner that would substantially eliminate electrical paths between the gate conductor and contact of FET devices of current and future generations of scaling.

Broadly, the inventive semiconducting device comprises:
a gate dielectric atop a semiconducting substrate, said semiconducting substrate containing source and drain regions adjacent said gate dielectric;
a gate conductor atop said gate dielectric;
a conformal dielectric passivation stack positioned on at least said gate conductor sidewalls, said conformal dielectric passivation stack containing a discontinuous electrical pathway; and
a contact to said source and drain regions, wherein said conformal dielectric passivation stack substantially eliminates shorting between said contact and said gate conductor.

In accordance with the present invention, the conformal dielectric passivation stack comprises a first conformal dielectric layer having at least one first seam and a second conformal dielectric layer deposited atop the first conformal dielectric layer, in which the second conformal dielectric layer covers the first seams of the first conformal dielectric layer. The second dielectric layer can be seamless or it can have seams which are offset from the seams present in the first dielectric layer. In one embodiment of the present invention, the conformal dielectric passivation stack comprises a first conformal dielectric layer having at least one first seam and a second conformal dielectric layer having at least one second seam, wherein the at least one first seam is offset from the at least one second seam to provide discontinuous seams, i.e., electrical pathways, through the conformal dielectric passivation stack. The conformal dielectric passivation stack may further include at least one other conformal dielectric layer that is seamless or having at least one other seam positioned between the first conformal dielectric layer and the second conformal dielectric layer, wherein the at least one other seam is offset from any seams that may be present in the second dielectric layer. Each of the dielectric layers in the conformal layered dielectric stack can comprise the same or a different material, in which the dielectric material may be a nitride, an oxide, or an oxynitride.

Another aspect of the present invention is a method of forming the above-described semiconducting structure, which includes a conformal dielectric passivation stack that does not include a continuous electrical path therethrough, e.g., having discontinuous seams. Broadly, the method of present invention comprises the steps of:

forming at least one gate region atop a semiconducting substrate, said at least one gate region comprising a gate conductor atop a gate dielectric;

forming source and drain regions adjacent said at least one gate region;

forming a conformal dielectric passivation stack on said at least one gate region, wherein said conformal dielectric passivation stack includes a discontinuous electrical path; and forming contacts to said source and drain regions, wherein said contacts are electrically isolated from said gate conductor by at least said conformal dielectric passivation stack.

DETAILED DESCRIPTION OF THE INVENTION

Figure 1:
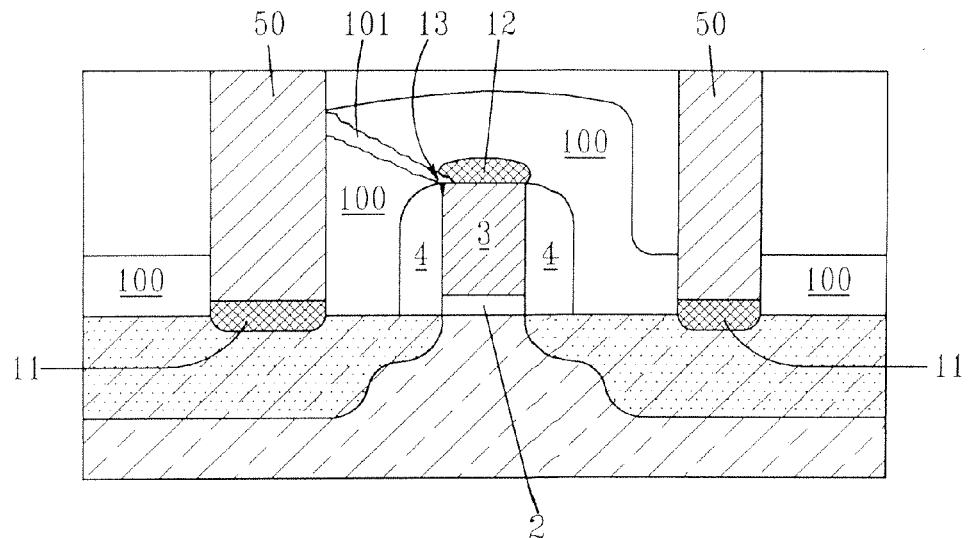
FIG. 1 is a pictorial representation (through a cross-sectional view) showing a prior FET incorporating a single passivation layer deposited atop a gate region in which seams in the passivation layer provide a continuous electrical path through the passivation layer to the gate conductor.

The present invention, which provides a method of passivating the gate conductor of a field effect transistor with a conformal dielectric passivation stack having discontinuous electrical pathways as well as the structure that is formed from the inventive method, will now be described in greater detail. It is noted that the drawings of the present application are provided for illustrative purposes and thus they are not drawn to scale. In particular, the dimensions of the seams and their relative position to each other have been enlarged to exemplify the present invention.

In the accompanying drawings, like and/or corresponding elements are referred to by like reference numbers. In the drawings, a single gate region is shown and described. Despite this illustration, the present invention is not limited to a structure including a single gate region. Instead, a plurality of such gate regions is contemplated.

Figure 2A:
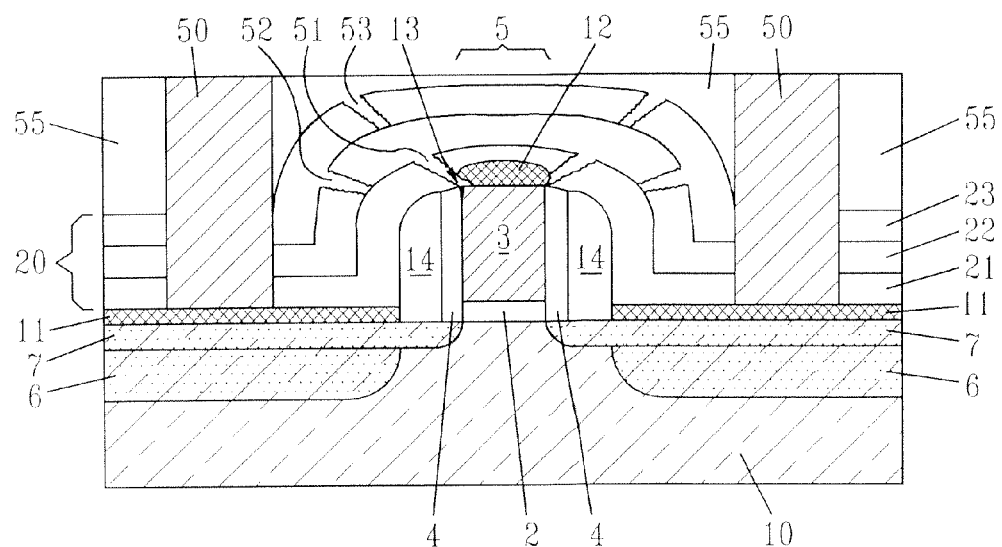
FIG. 2A is a pictorial representation (through a cross-sectional view) of one embodiment of the inventive semiconducting structure in which passivation of the gate conductor is provided by a conformal layered dielectric stack wherein electrical isolation of the gate conductor is provided by a discontinuity in seams between each dielectric layer of the conformal layered dielectric stack.

Referring to FIG. 2A, in one embodiment of the present invention, a field effect transistor (FET) is provided having a gate region 5 in which the gate conductor 3 is passivated by a conformal dielectric passivation stack 20. The gate region 5 also comprises a gate dielectric 2 underlying the gate conductor 3 and a gate silicide 12 atop the gate conductor 3.

The conformal dielectric passivation stack 20 comprises a plurality of dielectric layers 21, 22, 23 each having seams 51, 52, 53 offset from one another. The offset seams 51, 52, 53 of the plurality of dielectric layers 21, 22, 23 provide a conformal layered passivation stack 20 having discontinuous seams, in which the discontinuous seams ensure that the gate conductor 3 is electrically isolated from the contacts 50 to the device. Although the plurality of dielectric layers 21, 22, 23 preferably comprise $Si_3N_4$, the plurality of dielectric layers 21, 22, 23 may alternatively comprise an oxide, such as $SiO_2$, $Al_2O_3$, $HfO_2$, $ZrO_2$, HfSiO, other dielectric materials that are common to semiconductor processing or any combination thereof. Each of the dielectric layers 21, 22, 23 of the conformal dielectric passivation stack 20 may be the same or a different material.

The FET also comprises a semiconducting substrate 10 having source and drain extension regions 7, deep source and drain regions 6, and silicide contacts 11 located on a portion of the surface of the substrate 10 overlying the source and drain extension regions 7. A blanket dielectric layer 55 is formed atop the FET 20. Vias in the blanket dielectric layer 55 contain metal contacts 50 to the silicide contact 11 atop the source and drain regions.

One advantage of the inventive FET, as depicted in FIG. 2A, is that the offset in the seams in each of the plurality of dielectric layers 21, 22, 23 of the conformal dielectric passivation stack 20 provides a discontinuity in the seams through the conformal dielectric passivation stack 20. The discontinuity in the seams through the conformal dielectric passivation stack 20 ensures that the gate conductor 3 is electrically isolated. In prior FETs, as illustrated in FIG. 1, continuous seams through the passivation layer to the gate conductor provide an electrical path to the gate conductor that could result in shorting of device between the gate conductor 3 and the contacts 50 to the source and drain regions 6,7. Referring back to FIG. 2A, the inventive conformal dielectric passivation stack 20 comprising a plurality of dielectric layers 21, 22, 23 each having seams 51, 52, 53 offset from one another provide discontinuity between each of the seams, therefore ensuring electrical isolation of the gate conductor 3.

Figure 2B:
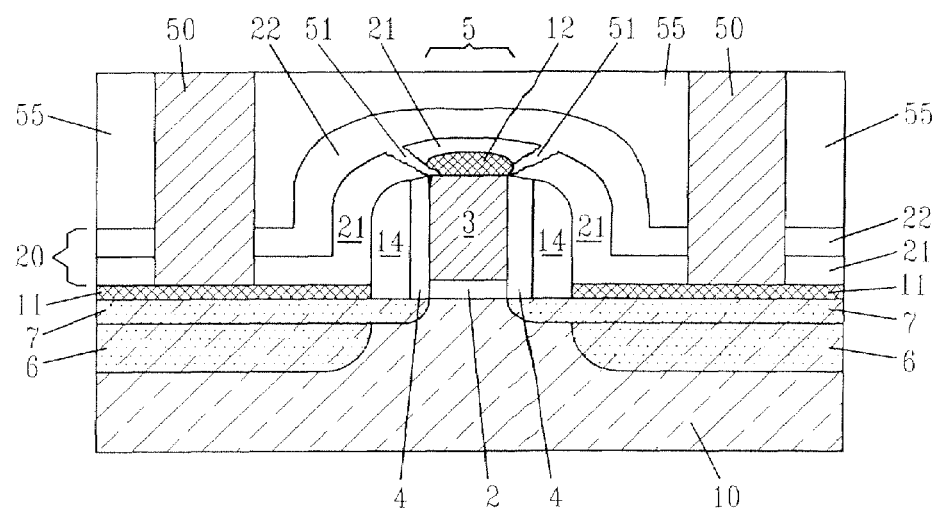
FIG. 2B is a pictorial representation (through a cross-sectional view) illustrating an embodiment in which the second dielectric layer within the conformal layered dielectric stack is seamless.

FIG. 2B shows another embodiment of the present invention in which the passivation stack 20 includes a first conformal dielectric 21 having seams 51 and a second dielectric 22 which is seamless.

Figure 3:
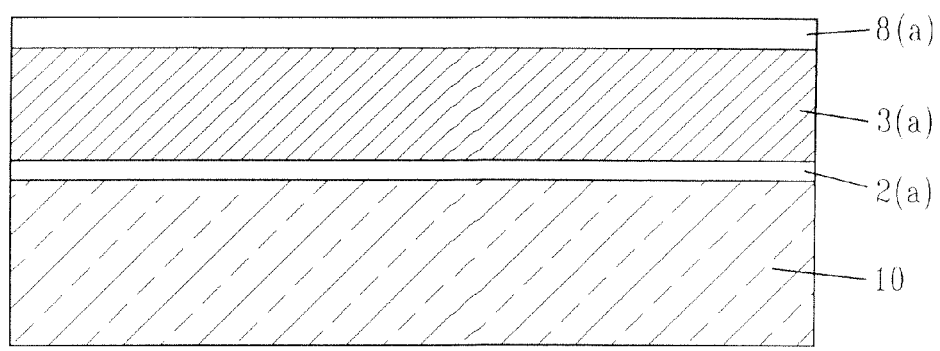
FIGS. 3-5 are pictorial representations (through cross-sectional views) showing the basic processing steps that are employed to produce the inventive semiconducting structure depicted in FIG. 2A.
Figure 4:
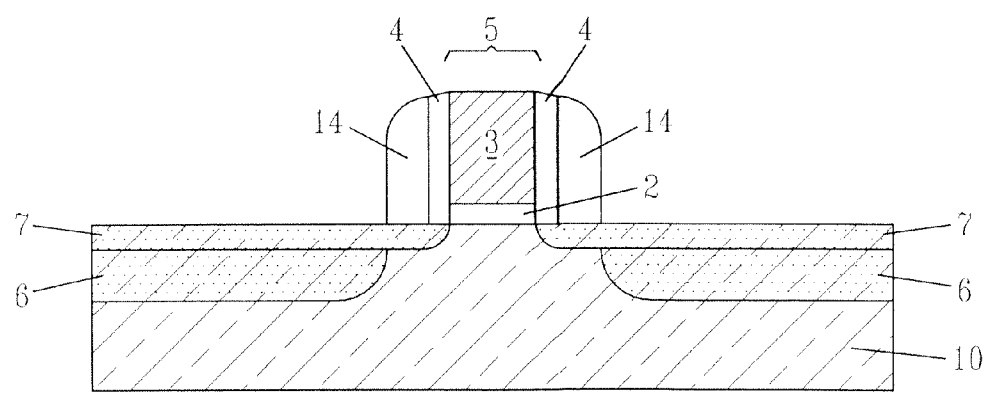
Figure 5:
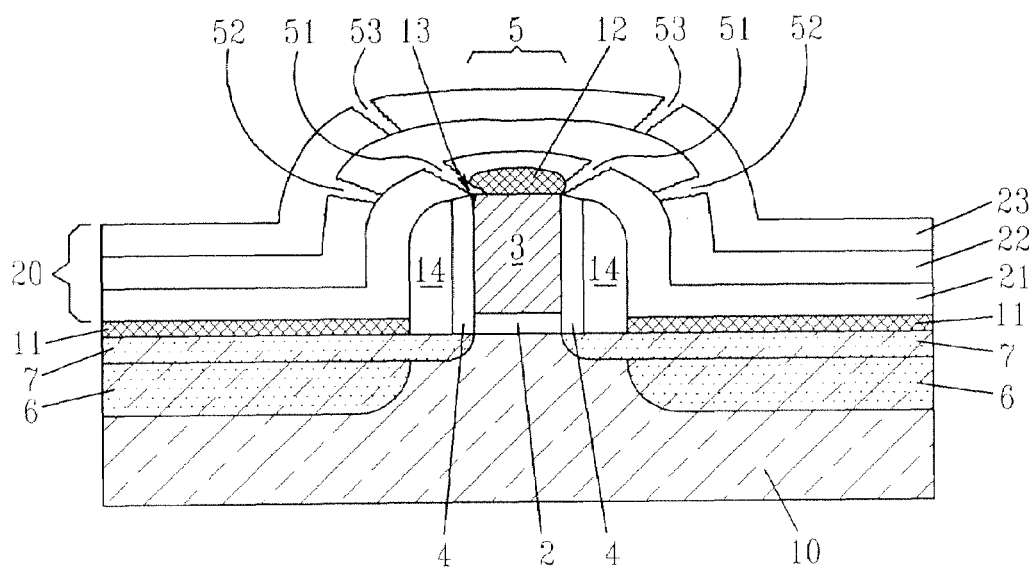

The method for forming the inventive FET shown in FIGS. 2A-2B are now described in greater detail referring to FIGS. 3-5. It is noted that drawing FIGS. 3-5 exemplify the embodiment shown in FIG. 2A. The methodology described below, however, can also be used in forming the structure shown in FIG. 2B except that the second dielectric film 22 of the passivation stack 20 is seamless. Seamless films are formed utilizing a high density plasma chemical vapor deposition process.

In accordance with the present invention, a gate region 5 is formed atop a substrate 10 utilizing conventional methods including deposition and lithography. Referring to FIG. 3, a gate stack is first provided atop the substrate 10 by depositing a gate dielectric layer 2(a) and then a gate conductor layer 3(a) using conventional deposition methods, such as chemical vapor deposition.

The substrate 10 includes, but is not limited to: any semiconducting material such as Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures.

When the substrate 10 is a silicon-on-insulator (SOI) or SiGe-on-insulator (SGOI) substrate, the thickness of the Si-containing layer atop the buried insulating layer typically has a thickness on the order of 10 nm or greater. The SOI or SGOI substrate may be fabricated using techniques that are well known to those skilled in the art. For example, the SOI or SGOI substrate may be fabricated using a thermal bonding process, or alternatively by an ion implantation process, which is referred to in the art as separation by ion implantation of oxygen (SIMOX).

Still referring to FIG. 3, the gate dielectric layer 2(a), formed atop the substrate 10, is typically an oxide material. The gate dielectric layer 2(a) may also be composed of a nitride, oxynitride, or a combination thereof. The gate dielectric layer 2(a) is formed using a conventional technique such as chemical vapor deposition (CVD), atomic layer CVD (AL-CVD), pulsed CVD, plasma assisted CVD, sputtering, and chemical solution deposition, or alternatively, the gate dielectric layer 2(a) is formed by a thermal growing process, which may include oxidation, oxynitridation, nitridation, and/or plasma or radical treatment. Suitable examples of oxides that can be employed as the gate dielectric layer 2(a) include, but are not limited to: $SiO_2$, $Al_2O_3$, $ZrO_2$, $HfO_2$, $Ta_2O_3$, $TiO_2$, perovskite-type oxides and combinations and multi-layers thereof. The gate dielectric layer 2(a) is subsequently etched to form the gate dielectric 2.

The gate conductor layer 3(a) is comprised of a conductive material such as polysilicon or an appropriate metal. The gate conductor layer 3(a) is formed atop the gate dielectric layer 2(a) utilizing a conventional deposition process such as CVD and sputtering. Preferably, the gate conductor layer 3(a) comprises doped polysilicon. The polysilicon dopant can be elements from Group III-A or an element from Group V of the Periodic Table of Elements. The dopant may be introduced during deposition of the gate conductor layer 3(a) after or following subsequent patterning and etching of the gate conductor 3. Although the gate conductor layer 3(a) preferably comprises doped polysilicon, the gate conductor material may also be comprised of, metal silicides, metallic nitrides, metals (for example, W, Ir, Re, Ru, Ti, Ta, Hf, Mo, Nb, Ni, or Al) or other conductive materials.

Still referring to FIG. 3, a gate cap layer 8(a) is then optionally formed atop the gate stack using deposition, photolithography, and etching. In one example, a gate cap layer 8(a) is first deposited atop the gate stack and then patterned using photolithography and etching. The gate cap layer 8(a) may comprise a dielectric that can be deposited by chemical vapor deposition (CVD) and related methods. Typically, gate cap layer 8(a) compositions include silicon oxides, silicon carbides, silicon nitrides, silicon carbonitrides, etc. Spin-on dielectrics may also be ulilized as the gate cap layer 8(a) including, but not limited to: silsesquioxanes, siloxanes, and boron phosphate silicate glass (BPSG).

The gate cap layer 8(a) is then patterned using photolithography. Specifically, a pattern is produced by applying a photoresist to the surface to be patterned, exposing the photoresist to a pattern of radiation, and then developing the pattern into the photoresist utilizing a conventional resist developer. Once the patterning of the photoresist is completed, the sections covered by the photoresist are protected, while the exposed regions are removed using a selective etching process that removes the unprotected regions of the gate cap layer forming the gate cap.

Referring to FIG. 4, following the formation of the gate cap, the gate stack is then etched by a directional etch process, such as reactive ion etching, having high selectivity for removing the material of the gate conductor layer 3(a) and the gate dielectric layer 2(a) without substantially etching the gate cap and the substrate 10. The resultant gate region 5 includes a gate conductor 3 positioned atop a gate dielectric 2. The gate cap 8(a) may then be removed using a chemical strip or etch process.

In a preferred embodiment, following the formation of the gate region 5, a thin sidewall spacer 4 is formed abutting and protecting the sidewalls of the gate region 5. Preferably, the thin sidewall spacer 4 is an oxide, such as $SiO_2$. The thin sidewall spacer 4 has a width that ranges from about 1 nm to about 20 nm, preferably being about 3 nm. Forming processes such as deposition or thermal growing may produce the thin sidewall spacer 4. Preferably, the thin sidewall spacer 4 is formed by a deposition process such as chemical vapor deposition (CVD), low-pressure chemical vapor deposition (LPCVD), rapid thermal chemical vapor deposition (RTCVD), or plasma enhanced chemical vapor deposition (PECVD) in combination with a directional reactive ion etch. Alternatively, the thin sidewall spacer 4 may be formed using a low temperature thermal oxidation of the gate region 5 in combination with a directional reactive ion etch.

Source and drain extension regions 7 are then formed in substrate 10 and partially extend under the gate region 5. The source and drain extension regions 7 are formed via ion implantation and comprise a combination of normally incident and angled implants to form the desired grading in the dopant regions. PFET devices are produced within Si-containing substrates by doping the source and drain extension regions 7 with elements from Group V of the Periodic Table of Elements. NFET devices are produced within Si-containing substrates by doping the source and drain extension regions 7 with elements from Group III-A of the Periodic Table of Elements. Halo regions can also be formed beneath the source and drain extension regions 7 using an angled ion implantation and a dopant having a conductivity type opposite the source and drain extension regions 7.

Still referring to FIG. 4, following source and drain extension region 7 implants, an offset spacer 14 may be formed abutting the exterior surface of the thin sidewall spacer 4. In an alternative embodiment, the offset spacer 14 may be formed abutting the gate conductor 3 by omitting the thin sidewall spacer 4. The offset spacer 14 is formed using conventional deposition and etching, both of which are well known in the art. The offset spacer 14 has a width that is greater than the width of the thin sidewall spacer 4. The width of the offset spacer 14 is dependent on the diffusivity of the dopant of the subsequently formed deep source and drain regions 6 and typically ranges from about 10 nm to about 60 nm. The offset spacer 14 can be comprised of a dielectric material such as a nitride or a combination of oxide and nitride materials, most preferably being $Si_3N_4$. It is noted that although only one offset spacer 14 is depicted in FIG. 4, multiple offset spacers have also been contemplated and are therefore within the scope of the present invention. Alternatively, the offset spacer 14 may be omitted.

Following offset spacer 14 formation, a higher energy ion implant is conducted to form deep source and drain regions 6. These implants are conducted at a higher energy and higher concentration of dopant than the source and drain extension region 7 implant. The deep source and drain regions 6 are typically doped with a dopant type consistent with the source and drain extension regions 7.

Following deep source and drain region 6 formation, the source and drain regions 6 and gate region 5 are activated by activation annealing using a conventional process such as, but not limited to: rapid thermal annealing, furnace annealing, flash lamp annealing or laser annealing. Activation anneal is conducted at a temperature ranging from about 850° C. to about 1350° C.

Referring to FIG. 5, in a next process step, suicide regions 11, 12 are then formed atop the source and drain regions and the gate region 5. Silicide formation typically requires depositing a metal layer onto the surface of a Si-containing material or wafer. The metal layer may be formed using a conventional process including, but not limited to: chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof, most preferably being Co or Ni. Following deposition, the structure is subjected to an annealing step using a conventional process such as, but not limited to: rapid thermal annealing. During annealing, the deposited metal reacts with Si forming a metal silicide. The gate silicide 12 formed atop the gate conductor 2 typically results in the production of a void 13 positioned along the sidewall of the interface of the gate conductor 3 and the gate silicide 12.

Following silicidation, a conformal dielectric passivation stack 20 is formed atop the gate region 5 and the substrate 10. The conformal dielectric passivation stack 20 comprises a plurality of dielectric passivation layers 21, 22, 23, in which each passivation dielectric layer has seams 51, 52, 53 that are offset from one another. The three layered stack 20 described is provided for illustrative purposes only. It is also possible in the present invention that the second dielectric passivation layer or subsequent dielectrics are seamless.

The first conformal dielectric layer 21 is formed atop the gate region 5 and the surface of the substrate 10 using a deposition or thermal growth process and may comprise an oxide, nitride or oxynitride, preferably being a nitride, such as $Si_3N_4$. The deposition process may comprise chemical vapor deposition (CVD) including, but not limited to: atomic pressure chemical vapor deposition (APCVD), low-pressure chemical vapor deposition (LPCVD), rapid thermal chemical vapor deposition (RTCVD), plasma enhanced chemical vapor deposition (PECVD), high density plasma chemical vapor deposition (HDPCVD) or atomic layer deposition (ALD). The thermal growth process may include thermal oxidation, nitridation or oxynitridation. Combinations of the aforementioned processes may also be used in forming the first conformal dielectric layer 21. In a preferred embodiment, the first conformal dielectric layer 21 is deposited using PECVD.

During deposition of the first conformal dielectric layer 21, seams 51 are typically formed extending from changes in topography in the deposition surface through the deposited layer. For example, as depicted in FIG. 5, a first seam 51 may be formed extending from the region 13 positioned on the sidewall of the gate region 5 at the interface between the gate silicide 12 and the gate conductor 3.

Still referring to FIG. 5, and in a next process step, a second conformal dielectric layer 22 is deposited atop the first conformal dielectric layer 21. The second dielectric layer 22 may comprise any dielectric material and may be formed using any deposition process, so long as the dielectric material of the second conformal dielectric layer 22 covers the first seams 51 in the first conformal dielectric layer 21. The second dielectric layer 22 typically includes second seams 52 that are offset from the first seams 51 of the first conformal dielectric layer 21, as depicted in FIG. 5.

In one embodiment, the second dielectric layer 22 may comprise the same dielectric material as the first dielectric layer 21 and may be formed using the same forming process as the first dielectric layer 21, so long as a break in the forming process of the first dielectric layer 21 and the second dielectric layer 22 is maintained. For example, the first conformal dielectric layer 21 of $Si_3N_4$ can be deposited and is followed by a break in deposition. Following the break in deposition, deposition of $Si_3N_4$ resumes to provide the second conformal dielectric layer 22 having second seams 52 that are offset from the first seams 51 of the first conformal dielectric layer 21. In this embodiment, the time period for the break in deposition must be sufficient to provide that the seams 51, 52 of the first conformal dielectric layer 21 and the second conformal dielectric layer 22 are offset from one another to ensure that the seams through the conformal dielectric passivation stack 20 are discontinuous.

In another embodiment of the present invention, the first conformal dielectric layer 21 and the second conformal dielectric layer 22 may comprise a different dielectric material. For example, since the first dielectric layer 21 preferably comprises a nitride, such as $Si_3N_4$, in this embodiment of the present invention, the second conformal dielectric layer 22 comprises an oxide, such as $SiO_2$, or an oxynitride, such as SiOxNy. Alternatively, the second conformal dielectric layer 22 may comprise a nitride when the first conformal dielectric layer 21 comprises an oxide or oxynitride.

In yet another embodiment of the present invention, the first conformal dielectric layer 21 and the second conformal dielectric layer 22 may be provided using different forming processes. For example, in a preferred embodiment, the first conformal dielectric layer 21 may be deposited using PECVD and the second conformal dielectric layer 22 may be deposited using another deposition process selected from the group consisting of, but not limited to: APCVD, LPCVD, RTCVD, PECVD, HDPCVD or ALD. In another example, the second conformal dielectric layer 22 may be formed using a thermal growth method such as thermal oxidation, nitridation or oxynitridation.

The conformal layered stack 20 may further include one or more other conformal dielectric layers 23. Although the conformal passivation stack 20 is depicted comprising three dielectric passivation layers 21, 22, 23, any number of dielectric layer as is contemplated and is thus within the scope of the invention, so long as the discontinuity of seams throughout the conformal passivation stack 20 is maintained. When other dielectrics are used, they may also be seamless.

Similar to the first conformal dielectric layer 21 and the second conformal dielectric layer 22, the other conformal dielectric layer 23 may comprise a nitride, oxide, or oxynitride deposited using deposition or thermal growth processes. The other conformal dielectric layer 23 may comprise the same or a different material than the first and second conformal dielectric layers 22, 23. The other conformal dielectric layer may be formed using the same forming process or a different forming process than the first and second conformal dielectric layers 22, 23. It is noted that the other passivation layer 23 may be omitted, in which the conformal dielectric passivation stack 20 consists of the first conformal dielectric layer 21 and the second conformal dielectric layer 22. The other passivation layer 23 may comprise a set of seams 53 that are offset from at least the seams 52 within the second conformal dielectric layer 22. Also, the other passivation layer 23 may be seamless.

The offset seams 51, 52, 53 of the plurality of dielectric passivation layers 21, 22, 23 provide a conformal dielectric passivation stack 20 having discontinuous seams, in which the discontinuous seams ensure that the gate conductor 3 is electrically isolated.

Following the formation of the conformal layered stack 20, an interlayer dielectric 55 is blanket deposited atop the structure depicted in FIG. 5 and planarized. The interlayer dielectric 55 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The interlayer dielectric 55 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The interlayer dielectric 55 is then patterned and etched using conventional photolithography and etching to form vias to expose a portion of the conformal dielectric passivation stack 20 overlying the silicide contacts 11. The silicide contacts 111 are then exposed by an etch chemistry that removes the exposed portions of the conformal dielectric passivation stack 20, without etching the interlayer dielectric 55 or the silicide contact 11. Metal contacts 50 to the silicide contact 11 are then formed by depositing a conductive metal into the via holes using conventional processing, such as sputtering or plating. The conductive metal may include, but is not limited to: tungsten, copper, aluminum, silver, gold, and alloys thereof.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconducting device comprising:
  a gate dielectric atop a semiconducting substrate, said semiconducting substrate containing source and drain regions adjacent said gate dielectric;
  a gate conductor atop said gate dielectric;
  a conformal dielectric passivation stack positioned on at least said gate conductor sidewalk, said conformal dielectric passivation stack comprising a first conformal dielectric layer having at least one first seam therein due to a step height of said gate conductor, and a second conformal dielectric layer having at least one second seam offset from said first seam, wherein said second conformal dielectric layer covers said at least one first seam to provide seams that are discontinuous through said conformal dielectric passivation stack thereby said conformal dielectric passivation stack contains a discontinuous electrical pathway;
  at least one other conformal dielectric layer that is seamless or having at least one other seam positioned between said first conformal dielectric layer and said second conformal dielectric layer, wherein said at least one other seam is offset from said at least one second seam; and
  a contact to said source and drain regions, wherein said conformal dielectric passivation stack substantially eliminates shorting between said contact and said gate conductor, wherein:
    said at least one other conformal dielectric layer, said first conformal dielectric layer, and said second conformal dielectric layer comprises a material selected from the group consisting of oxides, nitrides and oxynitrides; and
    said material of said at least one other conformal dielectric layer, said first conformal dielectric layer and said second conformal dielectric layer are a same composition.

2. A semiconducting device comprising:
  a gate dielectric atop a semiconducting substrate, said semiconducting substrate containing source and drain regions adjacent said gate dielectric;
  a gate conductor atop said gate dielectric;
  a conformal dielectric passivation stack positioned on at least said gate conductor sidewalls, said conformal dielectric passivation stack comprising a first conformal dielectric layer having at least one first seam therein due to a step height of said gate conductor, and a second conformal dielectric layer having at least one second seam offset from said first seam, wherein said second conformal dielectric layer covers said at least one first seam to provide seams that are discontinuous through said conformal dielectric passivation stack thereby said conformal dielectric passivation stack contains a discontinuous electrical pathway;
  at least one other conformal dielectric layer that is seamless or having at least one other seam positioned between said first conformal dielectric layer and said second conformal dielectric layer, wherein said at least one other seam is offset from said at least one second seam; and
  a contact to said source and drain regions, wherein said conformal dielectric passivation stack substantially eliminates shorting between said contact and said gate conductor, wherein said at least one other conformal dielectric layer, said first conformal dielectric layer, and said second conformal dielectric layer comprises a $Si_3N_4$ material.

* * * * *